(12) United States Patent
Toyoda et al.

(10) Patent No.: US 6,245,188 B1
(45) Date of Patent: Jun. 12, 2001

(54) PROCESS FOR THE REMOVAL OF RESIST MATERIAL

(75) Inventors: Eiji Toyoda; Makoto Namikawa; Takuji Okeyui, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/348,834

(22) Filed: Jul. 8, 1999

(30) Foreign Application Priority Data

| Jul. 8, 1998 | (JP) | 10-192994 |
| Nov. 13, 1998 | (JP) | 10-323798 |

(51) Int. Cl.⁷ .................................................. B32B 35/00
(52) U.S. Cl. ............................. 156/344; 156/85; 156/247
(58) Field of Search .................................... 156/247, 344, 156/584, 85

(56) References Cited

U.S. PATENT DOCUMENTS

| 5,466,325 | * | 11/1995 | Mizuno et al. | 156/344 |
| 6,040,110 | * | 3/2000 | Shirai et al. | 430/258 |
| 6,099,675 | * | 8/2000 | Yamamoto et al. | 156/241 |
| 6,126,772 | * | 10/2000 | Yamamoto et al. | 156/247 |

FOREIGN PATENT DOCUMENTS

| 002119847 | 5/1994 | (JP) . |
| 002119848 | 6/1998 | (JP) . |
| WO 97/00534 | 1/1997 | (WO) . |

* cited by examiner

*Primary Examiner*—Mark A. Osele
(74) *Attorney, Agent, or Firm*—Sughrue, Mion, Zinn, Macpeak & Seas, PLLC

(57) ABSTRACT

The present invention provides a process for the peeling of a resist material with a pressure-sensitive adhesive sheet which involves the improvement in the removal of resist material or the enhancement of peelability of resist material to certainly remove the resist material from the object regardless of the properties or treated state of the resist material. The process comprises (1) after the application of the pressure-sensitive adhesive sheet, effecting a stress-imparting treatment which causes shrinkage or expansion of the pressure-sensitive adhesive sheet so that a stress develops at the interface between the resist material and the object or (2) prior to the application of the resist material to the object, effecting surface treatment to the object such that the surface of the object has a surface free energy of to not greater than 60 dyne/cm.

6 Claims, No Drawings

PROCESS FOR THE REMOVAL OF RESIST MATERIAL

FIELD OF THE INVENTION

The present invention relates to a process for the removal of an unnecessary resist material from an object such as semiconductor wafer at a step of forming a fine pattern during the preparation of semiconductors, circuits, printed circuit boards, liquid crystal panels, etc.

BACKGROUND OF THE INVENTION

In the process for the preparation of a semiconductor device, for example, a resist material is applied to a wafer such as silicon. The resist material is then subjected to ordinary photographic process to form an image made of resist pattern. With this image as a mask, the wafer is then etched. Unnecessary resist material is then removed. This procedure is then repeated. Unnecessary resist material is removed also in the case where a circuit is formed on various circuit boards.

With the recent tendency towards the enhancement of the density and integration of LSI and the density and size of liquid crystal panel, it has been important more and more from the standpoint of yield and reliability of product to simply and certainly remove unnecessary resist material from semiconductor wafer or glass substrate. Heretofore, a dry removal process using an asher (carbonization apparatus) or a wet removal process using a resist removing solvent has been normally employed at the step of removing unnecessary resist material.

However, the removal process using an asher is disadvantageous in that it takes much time to remove a resist material which has been doped with ions at a high dose. If plasma ashing is effected, the semiconductor substrate can be damaged by plasma. The wet removal process using a resist removing solvent is disadvantageous in that it deteriorates the working atmosphere and discharges waste liquid that pollutes the global atmosphere. This wet removal process is also disadvantageous in that the resist material which has once been removed could be again attached to the wafer.

In order to solve these problems, a process for the removal of a resist material has been proposed involving the use of a sheet-like or tape-like pressure-sensitive adhesive sheet. This removal process comprises applying a pressure-sensitive adhesive sheet to an object having a resist material provided thereon so that the resist material is fixed to the pressure-sensitive adhesive layer, and then peeling the pressure-sensitive adhesive sheet off the object together with the resist material to remove the resist material from the object. This removal process is free from the problems inherent to the conventional removal processes using an asher or solvent, contributing to the enhancement of the yield of product.

However, the foregoing removal process using a pressure-sensitive adhesive sheet is disadvantageous in that, in cases where some kinds of resist material are used or some kinds of treatment on resist material are effected, the resist material can not be removed completely from an object such as semiconductor substrate. In particular, resist materials doped with ions at a dose as high as not less than $1 \times 10^{15}$ ions/cm$^2$ can be hardly peeled off the substrate in most cases.

SUMMARY OF THE INVENTION

It is therefore an object of the present invention to provide a process for the peeling of a resist material with a pressure-sensitive adhesive sheet which involves the improvement in the removal of resist material or the enhancement of peelability of resist material to certainly remove the resist material from the object regardless of the properties or treated state of the resist material.

The inventors made extensive studies of the foregoing object of the present invention. As a result, it was found as a first aspect that, by cooling the pressure-sensitive adhesive sheet together with the resist material and the object or heating them and then cooling, prior to peeling of a pressure-sensitive adhesive sheet applied to the upper surface of a resist material on an object such as semiconductor substrate, the shrinkage or expansion of the pressure-sensitive adhesive sheet is caused to impart a stress to the interface between the resist material and the object, thereby enhancing the peelability of the resist material and hence making it possible to simply and certainly remove the resist material from the object regardless of the properties of the resist material or other factors.

Furthermore, it was found as a second aspect that, prior to the application of the resist material to the object, by effecting a specific surface treatment to the object such that the surface of the object has a surface free energy of not greater than a predetermined value, the peelability of the resist material provided thereon can be enhanced, making it possible to certainly remove the resist material off the object with a pressure-sensitive adhesive sheet regardless of the treated state of the resist material and drastically enhance the reliability in peeling.

DETAILED DESCRIPTION OF THE INVENTION

The first aspect of the present invention especially concerns the following embodiments:

(1) A process for the removal of a resist material which comprises applying a pressure-sensitive adhesive sheet to the upper surface of a resist material present on an object, and then peeling the pressure-sensitive adhesive sheet together with the resist material to remove the resist material from the object, and after the application of the pressure-sensitive adhesive sheet, effecting a stress-imparting treatment which causes shrinkage or expansion of the pressure-sensitive adhesive sheet so that a stress develops at the interface between the resist material and the object, (2) A process for the removal of a resist material of item (1), wherein the pressure-sensitive adhesive sheet comprises a curing type pressure-sensitive adhesive layer, and after the application of the pressure-sensitive adhesive sheet, a curing treatment for the curing type pressure-sensitive adhesive layer is effected and then the stress-imparting treatment is effected, (3) A process for the removal of a resist material of item (1) or (2), wherein the stress-imparting treatment comprises (1) cooling the pressure-sensitive adhesive sheet, together with the resist material and object, to a temperature of not higher than 0° C. or (2) heating them to a temperature of not lower than 100° C. and then allowing the pressure-sensitive adhesive sheet to cool to room temperature., and (4) A process for the removal of a resist material, wherein the pressure-sensitive adhesive sheet comprises an ultraviolet-curing pressure-sensitive adhesive layer, and, after the application of the pressure-sensitive adhesive sheet, irradiation of ultraviolet rays to the pressure-sensitive adhesive layer being in a thermally plasticized form is effected to cure the pressure-sensitive adhesive layer, and then spontaneous or forced cooling to room temperature is effected, whereby the curing treatment and stress-imparting treatment are effected simultaneously.

The term "object having a resist material provided thereon" as used herein is meant to indicate, e.g., one obtained by a process which comprises applying a known resist material to an object such as semiconductor substrate and glass substrate, subjecting the substrate to ordinary photographic process to form a predetermined resist pattern (resist film image) thereon, injecting ions such as $As^+$, $P^+$ and $B^+$ into the substrate at the open side thereof with the resist material as a mask, and then subjecting the substrate to any other suitable treatments such as etching. The thickness of the resist material, if used as a mask with which ions are injected into the substrate, is normally in a range of from about 1 to 5 µm, but is not specifically limited.

In the first aspect of the present invention, a pressure-sensitive adhesive sheet is applied to the upper surface of the resist material present on the object. The application of the pressure-sensitive adhesive sheet may be effected at ordinary temperature. However, the pressure-sensitive adhesive sheet is preferably thermally contact-bonded to the resist material to allow the resist material and the pressure-sensitive adhesive layer to come in close contact with each other. This thermal contact bonding is accompanied by some expansion or shrinkage. However, the expansion or shrinkage is not so strong enough to cause such a stress at the interface between the resist material and the object that a good peelability imparts to the resist material.

The pressure-sensitive adhesive sheet to be used herein is a sheet-like or tape-like film substrate having formed thereon a pressure-sensitive adhesive layer generally having a thickness of from 20 to 150 µm. Examples of the film substrate include plastic films made of various synthetic resins and generally having a thickness of from 10 to 1,000 µm. Examples of the synthetic resins include polyester, polycarbonate, polyethylene, polypropylene, ethylene-propylene copolymer, ethylene-vinyl acetate copolymer and ethylene-ethyl acrylate copolymer.

The pressure-sensitive adhesive layer may be of non-curing type. However, the pressure-sensitive adhesive layer is preferably of curing type in terms of complete removal of the resist material. The curing type pressure-sensitive adhesive layer may be made of a pressure-sensitive adhesive which cures (solidifies) when cooled from hot state, such as hot melt pressure-sensitive adhesive, or a polymerization-curable pressure-sensitive adhesive comprising a curable compound and a polymerization catalyst incorporated in a pressure-sensitive adhesive polymer such as acrylic polymer. Preferred among these pressure-sensitive adhesives is polymerization-curable pressure-sensitive adhesive, particularly an ultraviolet-curing pressure-sensitive adhesive.

The linear expansion coefficient of such a pressure-sensitive adhesive layer is preferably not less than $1 \times 10^{-4}/°$C. to transmit more effectively a stress to the interface of the resist material with the object such as semiconductor substrate. The ratio of the linear expansion coefficient of the pressure-sensitive adhesive layer to the linear expansion coefficient of the object such as semiconductor substrate is preferably 2 or more, more preferably 10 or more. The linear expansion coefficient of the silicon wafer is normally about $3 \times 10^{-6}/°$C. If the linear expansion coefficient of the pressure-sensitive adhesive layer is as specified above, the ratio of the linear expansion coefficient of the two components satisfies the above-specified range sufficiently.

The term "linear expansion coefficient" as used herein means the amount indicating the ratio of the change in thermal expansion of a solid under a predetermined pressure with temperature. The linear expansion coefficient can be represented by the following equation. For the measurement of the thermal expansion of the pressure-sensitive adhesive layer of the present invention, TMA (thermal mechanical analysis) apparatus may be used.

Linear expansion coefficient $\alpha = (1/L^0) \cdot (dL/dt)$ wherein $L^0$ represents the length of the object at $0°$ C.; and L represents the length of the object at $t°$ C.

In the first aspect of the present invention, when the pressure-sensitive adhesive sheet has a curing type pressure-sensitive adhesive layer, after the pressuresensitive adhesive sheet is applied to the upper surface of the resist material provided on the object, a predetermined curing treatment is effected, and a stress-imparting treatment is then effected. The stress-imparting treatment comprises (1) cooling the pressure-sensitive adhesive sheet together with the resist material and the object to a temperature of not higher than $0°$ C. or (2) heating them to a temperature of not higher than $100°$ C. and then allowing them to cool to room temperature. For the former cooling process, the material may be directly cooled with liquefied nitrogen or dry ice. Alternatively, the material may be allowed to come in contact with a liquid or metallic fixture which has been cooled with liquefied nitrogen or dry ice.

The foregoing curing type pressure-sensitive adhesive layer may be subjected to the application of stress at the same time with curing. In particular, the ultraviolet-curing pressure-sensitive adhesive layer can be irradiated with ultraviolet rays in thermally plasticized state (generally from 40 to $150°$ C.), and then allowed to cool or forcedly cooled to room temperature so that it can be cured and provided with a stress at the same time. According to this process, the application of stress can be simply effected. In particular, if the irradiation with ultraviolet rays is effected in thermally plasticized state, curing can be accelerated, making it possible to complete curing in a short period of time.

The foregoing application of stress causes the pressure-sensitive adhesive sheet to shrink or expand/shrink. This accompanies the generation of a shearing stress at the interface of the resist material with the object that reduces the adhesion of the resist material with the object. In the present invention, the pressure-sensitive adhesive sheet can be easily peeled off the object together with the resist material under these circumstances. In this manner, the resist material cannot be left behind even if the resist material has been modified by ions injected to form a hard surface layer, i.e., the resist material exhibits any properties. Thus, a desired good peelability can be realized with a good reproducibility.

Next, the second aspect of the present invention will be described in detail.

The second aspect concerns a process for the removal of a resist material which comprises applying a pressure-sensitive adhesive sheet to the upper surface of a resist material present on an object, and then peeling the pressure-sensitive adhesive sheet together with the resist material to remove the resist material from the object, wherein, prior to the application of the resist material to the object, surface treatment to the object is effected such that the surface of the object has a surface free energy of to not greater than 60 dyne/cm. The second aspect also concerns the foregoing process for the removal of a resist material, wherein a surface treatment to the object is effected such that the surface of the object has a contact angle with respect to water of not less than $40°$.

The term "surface free energy of object" as used herein is meant to indicate the surface free energy determined by solving the following equation (1) derived from Young's equation and Fowkers' extended equation in the contact angle of the surface of an object with water and methyl iodide and the surface free energy of these liquids (known from references).

$$(1+\cos\theta)\gamma 1 = 2\sqrt{(\gamma s^d \gamma 1^d)} + 2\sqrt{(\gamma s^p \gamma 1^p)} \quad (1)$$

where θ: contact angle;

γ1: surface free energy of liquid for measuring contact angle;

$\gamma 1^d$: dispersing force component in γ1;

$\gamma 1^p$: polar force component in γ1;

$\gamma s^d$: dispersing force component in surface free energy of solid (object); and $\gamma s^p$: polar force component in surface free energy of solid (object)

In the second aspect of the present invention, prior to the application of the resist material to an object such as semiconductor wafer, the surface treatment to the side of the object which the resist material is to be provided on is effected to provide a surface having a surface free energy of not more than 60 dyne/cm, preferably from 30 to 50 dyne/cm. It is preferred that the surface treatment provides a surface having a contact angle with respect to water of not less than 40°, particularly from 55 to 80°. When a resist material is provided on the object subjected to the surface treatment, the resist material exhibits a properly reduced adhesion, making it easy for the pressure-sensitive adhesive sheet to peel at the subsequent step.

The above-described surface treatment can be accomplished by chemical method or physical method, singly or in combination. Examples of the surface treatment include a hydrophobic treatment process which comprises exposing an object such as semiconductor wafer to vapor of an organic silicon compound such as hexamethyl disilazane, and then subjecting the wafer to heat treatment. In accordance with this process, the surface free energy of the object and the contact angle of the surface of the object with water can be controlled to the above-described ranges by adjusting the exposing time. If the foregoing adjustment is insufficient, and the surface free energy and other factors cannot be controlled to the above-described ranges, the resist material cannot exhibit good peelability.

A known resist material is then applied to the object thus surface-treated. The object is then subjected to ordinary photographic process to form a predetermined resist pattern (resist film image) thereon. Ions such as $As^+$, $P^+$ and $B^+$ are then injected into the object at the open side thereof with the resist material as a mask. The object is then subjected to various treatments such as etching. Finally, unnecessary resist material (resist film image) is removed to form a circuit.

The removal of the resist material can be accomplished by a process which comprises applying a pressure-sensitive adhesive sheet to the upper surface of the resist material, and then peeling the pressure-sensitive adhesive sheet together with the resist material. The pressure-sensitive adhesive sheet is a sheet-like or tape-like form and comprises a film generally having 10 to 1,000 μm as a substrate and a pressure-sensitive adhesive layer generally having a thickness of 20 to 150 μm provided on the substrate. Examples of the material constituting the film includes polyester, polycarbonate, polyethylene, polypropylene, ethylene-propylene copolymer, ethylene-vinyl acetate copolymer, and ethylene-ethyl acrylate copolymer.

The pressure-sensitive adhesive layer may be of non-curing type. However, the pressure-sensitive adhesive layer is preferably of curing type in terms of complete removal of the resist material. The curing type pressure-sensitive adhesive layer may be made of a pressure-sensitive adhesive which cures (solidifies) when cooled from hot state, such as hot melt pressure-sensitive adhesive or a polymerization-curable pressure-sensitive adhesive comprising a curable compound and a polymerization catalyst incorporated in a pressure-sensitive adhesive polymer such as acrylic polymer. Preferred among these pressure-sensitive adhesives is a polymerization-curable pressure-sensitive adhesive, particularly an ultraviolet-curing pressure-sensitive adhesive.

In accordance with the foregoing peeling process, the resist material can be removed from the object together with the pressure-sensitive adhesive sheet. Since the surface free energy of the object has been controlled to the above-specified range to give a properly reduced adhesion between the object and the resist material, the resist material can be certainly removed from the object by the foregoing peeling process without leaving itself behind on the object regardless of the treated state of the resist material, e.g., even if the resist material has been modified by ions injected to form a hard surface layer thereon.

The present invention is not limited to production of semiconductor devices. The application of the present invention is not limited so far as the object has a patterned resist material formed thereon. In practice, however, it goes without saying that the present invention can be applied to various objects.

The present invention will be further described in the following examples, but the present invention should not be construed as being limited thereto. The term "parts" as used herein is meant to indicate "parts by weight".

REFERENCE EXAMPLE 1

A positive-working resist was applied to a silicon wafer having formed thereon an oxide layer having a thickness of 10 nm according to a CVD method to form a resist layer having a thickness of 1 μm, heated, exposed to light, and then subjected to development to form a resist film image thereon. $P^+$ ions were then injected into the silicon wafer at an injection energy of 80 keV and an injection density of $1\times10^{16}$ ions/cm$^2$ with the resist film image as a mask.

EXAMPLE 1-1

80 parts of n-butyl acrylate, 15 parts of ethyl acrylate and 5 parts of acrylic acid were allowed to undergo solution polymerization with 150 parts of ethyl acrylate and 0.1 parts of azobisisobutyronitrile at a temperature of 60° C. in a stream of nitrogen for 12 hours to obtain a solution of an acrylic polymer having a weight-average molecular weight of 500,000. The solution thus obtained was then uniformly mixed with a polyethylene glycol diacrylate as a curable compound, a urethane acrylate ("U-N-01", produced by Shinnakamura Chemical Co., Ltd.), a polyfunctional isocyanate compound ("Coronate L", produced by Nippon Polyurethane Industry Co., Ltd.) and dimethoxy(phenyl)methyl phenyl ketone as a photopolymerization initiator in an amount of 50 parts, 50 parts, 3 parts and 3 parts, respectively, based on 100 parts of the acrylic polymer to prepare a solution of ultraviolet-curing pressure-sensitive adhesive.

The pressure-sensitive adhesive solution thus prepared was applied to a polyester film having a thickness of 50 μm to provide a dry thickness of 35 μm, and then dried at a temperature of 130° C. for 3 minutes to prepare a pressure-sensitive adhesive sheet having an ultraviolet-curing pressure-sensitive adhesive layer. The pressure-sensitive adhesive sheet thus prepared exhibits a very small adhesion to silicon wafer before as well as after curing by irradiation with ultraviolet rays. In some detail, the pressure-sensitive adhesive sheet exhibited a 180° peel strength (at 20° C.) of 13 g/10 mm width with respect to silicon wafer before curing by irradiation with ultraviolet rays. The pressure-sensitive adhesive sheet exhibited a 180° peel strength (at 20° C.) of 8 g/10 mm width with respect to silicon wafer after curing by irradiation with ultraviolet rays. 20° C. The pressure-sensitive adhesive layer thus ultraviolet-cured exhibited a linear expansion coefficient of $2.4 \times 10^{-4}$/° C.

Subsequently, the foregoing ultraviolet-curing pressure-sensitive adhesive sheet was contact-bonded to the upper surface of the resist film image on the silicon wafer prepared by the method of Reference Example 1 over a 130° C. hot plate for 30 seconds. Thereafter, the silicon wafer was irradiated with ultraviolet rays from a high pressure mercury vapor lamp at a dose of 900 mJ/cm$^2$ so that the pressure-sensitive adhesive was cured. The whole silicon wafer was then cooled to –196° C. with liquefied nitrogen. Thereafter, when the pressure-sensitive adhesive sheet was peeled, the resist material, too, was removed from the silicon wafer. The silicon wafer from which the resist material had been thus removed was then observed under microscope. As a result, no resist material was observed left behind on the silicon wafer.

EXAMPLE 1-2

The same pressure-sensitive adhesive sheet as used in Example 1-1 was applied to the upper surface of the resist film image on the silicon wafer prepared by the method of Reference Example 1 over a 130° C. hot plate for 30 seconds and then irradiated with ultraviolet rays in the same manner as in Example 1—1. The silicon wafer was then heated to a temperature of 180° C. for 30 seconds. The silicon wafer was then allowed to cool to room temperature. When the pressure-sensitive adhesive sheet was peeled, the resist material, too, was removed from the silicon wafer. The silicon wafer from which the resist material had been thus removed was then observed under microscope. As a result, no resist material was observed left behind on the silicon wafer.

EXAMPLE 1-3

The same pressure-sensitive adhesive sheet as used in Example 1-1 was contact-bonded to the upper surface of the resist film image on the silicon wafer prepared by the method of Reference Example 1 over a 130° C. hot plate for 30 seconds in the same manner as in Example 1-1. Thereafter, the silicon wafer was irradiated with ultraviolet rays from a high pressure mercury vapor lamp at a dose of 100 mJ/cm$^2$ while the pressure-sensitive adhesive sheet was being kept heated to the same temperature so that the pressure-sensitive adhesive was cured. The silicon wafer was then allowed to cool to room temperature. When the pressure-sensitive adhesive sheet was peeled, the resist material, too, was removed from the silicon wafer. The silicon wafer from which the resist material had been thus removed was then observed under microscope. As a result, no resist material was observed left behind on the silicon wafer.

COMPARATIVE EXAMPLE 1-1

The same pressure-sensitive adhesive sheet as used in Example 1-1 was applied to the upper surface of the resist film image on the silicon wafer prepared by the method of Reference Example 1 and then irradiated with ultraviolet rays in the same manner as in Example 1-1. The pressure-sensitive adhesive sheet was then immediately peeled. As a result, a large portion of the resist material was removed. When observed under microscope, however, the silicon wafer had a slight amount of resist material left behind thereon (30 $\mu$m□, i.e., in the area of 30 $\mu$m×30 $\mu$m).

EXAMPLE 2-1

A silicon wafer having an oxide layer having a thickness of 10 nm formed thereon according to a CVD (Chemical Vapor Deposition) process was exposed to vapor of hexamethyl disilazane at a temperature of 80° C. for 5 minutes, and then subjected to heat treatment in dried air at a temperature of 180° C. for 90 seconds. The silicon wafer thus processed exhibited a surface free energy of 40.6 dyne/cm and a contact angle of 65.0° with respect to water. A negative-working resist material was applied to the silicon wafer to provide a resist layer having a thickness of 1 $\mu$m, heated, exposed to light, and then subjected to development to form a resist film image thereon. P$^+$ ions were then injected into the silicon wafer at an injection energy of 80 keV and an injection density of $1 \times 10^{16}$ ions/cm$^2$ with the resist film image as a mask.

An ultraviolet-curing pressure-sensitive adhesive sheet was then contact-bonded to the silicon wafer thus prepared over a 130° C. hot plate. Thereafter, the silicon wafer was irradiated with ultraviolet rays from a high pressure mercury vapor lamp at a dose of 900 mJ/cm$^2$ so that the pressure-sensitive adhesive was cured. When the pressure-sensitive adhesive sheet was peeled, the resist material (resist film image), too, was removed away from the silicon wafer. The surface of the silicon wafer was then observed under microscope. As a result, the silicon wafer was observed completely free of resist material.

The foregoing ultraviolet-curing pressure-sensitive adhesive sheet had been prepared by the following method. In some detail, a monomer mixture comprising 80 parts of n-butyl acrylate, 15 parts of ethyl acrylate and 5 parts of acrylic acid was allowed to undergo solution polymerization with 150 parts of ethyl acetate and 0.1 parts of azobisisobutyronitrile in a stream of nitrogen at a temperature of 60° C. for 12 hours to obtain a solution of acrylic polymer having a weight-average molecular weight of 500,000.

The solution thus obtained was then uniformly mixed with a polyethylene glycol diacrylate as a curable compound, a urethane acrylate ("U-N-01", produced by Shinnakamura Chemical Co., Ltd.), an isocyanate compound ("Coronate L", produced by Nippon Polyurethane Industry Co., Ltd.) as a polyfunctional compound and dimethoxy(phenyl)methyl phenyl ketone as a photopolymerization initiator in an amount of 50 parts, 50 parts, 3 parts and 3 parts, respectively, based on 100 parts of the acrylic polymer to prepare a solution of ultraviolet-curing pressure-sensitive adhesive.

Subsequently, the pressure-sensitive adhesive solution thus prepared was applied to a substrate made of a polyester film having a thickness of 50 $\mu$m to provide a dry thickness of 35 $\mu$m, and then dried at a temperature of 130° C. for 3 minutes to prepare an ultraviolet-curing pressure-sensitive adhesive sheet. The pressure-sensitive adhesive sheet exhibited a 180° peel strength (at 20° C.) of 10 g/10 mm width with respect to silicon wafer before curing by irradiation with ultraviolet rays. The pressure-sensitive adhesive sheet exhibited a 180° peel strength (at 20° C.) of 13 g/10 mm width with respect to silicon wafer after curing by irradiation with ultraviolet rays.

EXAMPLE 2-2

A silicon wafer having an oxide layer having a thickness of 10 nm formed thereon according to a CVD process was exposed to vapor of hexamethyl disilazane at a temperature of 80° C. for 2 minutes, and then subjected to heat treatment in dried air at a temperature of 180° C. for 90 seconds. The silicon wafer thus processed exhibited a surface free energy of 44.3 dyne/cm and a contact angle of 60.1° with respect to water. A resist film image was then formed on the silicon wafer in the same manner as in Example 2-1. Ions were then injected into the silicon wafer with the resist film image as a mask in the same manner as in Example 2-1.

The same ultraviolet-curing pressure-sensitive adhesive sheet as used in Example 2-1 was then applied to the silicon wafer thus prepared in the same manner as in Example 2-1. The silicon wafer was then subjected to curing in the same manner as in Example 2-1. When the pressure-sensitive adhesive sheet was peeled, the resist material (resist film image), too, was removed away from the silicon wafer. The surface of the silicon wafer was then observed under microscope. As a result, the silicon wafer was observed completely free of resist material.

COMPARATIVE EXAMPLE 2-1

A silicon wafer having an oxide layer having a thickness of 10 nm formed thereon according to a CVD process was exposed to vapor of hexamethyl disilazane at a temperature of 80° C. for 10 seconds, and then subjected to heat treatment in dried air at a temperature of 180° C. for 90 seconds. The silicon wafer thus processed exhibited a surface free energy of 61.8 dyne/cm and a contact angle of 36.1° with respect to water. A resist film image was then formed on the silicon wafer in the same manner as in Example 2-1. Ions were then injected into the silicon wafer with the resist film image as a mask in the same manner as in Example 2-1.

The same ultraviolet-curing pressure-sensitive adhesive sheet as used in Example 2-1 was then applied to the silicon wafer thus prepared in the same manner as in Example 2-1. The silicon wafer was then subjected to curing in the same manner as in Example 2-1. When the pressure-sensitive adhesive sheet was peeled, the resist material (resist film image), too, was removed away from the silicon wafer. The surface of the silicon wafer was then observed under microscope. As a result, most part of the resist material was observed removed but a slight amount of resist material was observed left behind on the silicon wafer (about 30 $\mu m\square$). Thus, this comparative process leaves something to be desired.

As mentioned above, the present invention can provide a process for the removal of a resist material which comprises applying a pressure-sensitive adhesive sheet to the upper surface of a resist material on an object such as semiconductor substrate, and then peeling the pressure-sensitive adhesive sheet together with the resist material, wherein, after the application of the pressure-sensitive adhesive sheet, effecting a stress-imparting treatment which causes shrinkage or expansion of the pressure-sensitive adhesive sheet so that a stress develops at the interface between the resist material and the object, whereby the resist material can be removed away from the object easily and certainly regardless of the properties thereof, i.e., the resist material can be completely peeled off the object with a good reproducibility, making it possible to enhance the reliability in peeling.

The present invention also provides an industrially useful process for the removal of a resist material which comprises peeling a resist material off an object with a pressure-sensitive adhesive sheet, wherein, prior to the application of the resist material to the object, surface treatment to the object is effected such that the surface of the object has a surface free energy of to not greater than a predetermined value, whereby the peelability of the resist material provided thereon can be enhanced, making it possible to certainly remove the resist material off the object regardless of the treated state of the resist material.

While the invention has been described in detail and with reference to specific embodiments thereof, it will be apparent to one skilled in the art that various changes and modifications can be made therein without departing from the spirit and scope thereof.

What is claimed is:

1. A process for the removal of a resist material which comprises applying a pressure-sensitive adhesive sheet to the upper surface of a resist material present on an object, and then peeling said pressure-sensitive adhesive sheet together with said resist material to remove said resist material from said object,
   which further comprises, after the application of said pressure-sensitive adhesive sheet, effecting a stress-imparting treatment which causes shrinkage or expansion of said pressure-sensitive adhesive sheet so that a stress develops at the interface between said resist material and said object.

2. The process for the removal of a resist material according to claim 1, wherein the ratio of linear expansion coefficient of pressure-sensitive adhesive layer in said pressure-sensitive adhesive sheet to linear expansion coefficient of said object is not less than 2.

3. The process for the removal of a resist material according to claim 1, wherein said pressure-sensitive adhesive sheet comprises a curing type pressure-sensitive adhesive layer, and after the application of said pressure-sensitive adhesive sheet, a curing treatment for the curing type pressure-sensitive adhesive layer is effected and then the stress-imparting treatment is effected.

4. The process for the removal of a resist material according to claim 1, wherein said stress-imparting treatment comprises (1) cooling said pressure-sensitive adhesive sheet, together with said resist material and object, to a temperature of not higher than 0° C. or (2) heating said pressure-sensitive adhesive sheet to a temperature of not lower than 100° C. and then allowing said pressure-sensitive adhesive sheet, together with said resist material and object, to cool to room temperature.

5. The process for the removal of a resist material according to claim 1, wherein said pressure-sensitive adhesive sheet comprises a curing type pressure-sensitive adhesive layer, and a curing treatment for the curing type pressure-sensitive adhesive layer and the stress-imparting treatment are effected simultaneously.

6. The process for the removal of a resist material according to claim 5, wherein said pressure-sensitive adhesive sheet comprises an ultraviolet-curing pressure-sensitive adhesive layer, and, after the application of said pressure-sensitive adhesive sheet, irradiation of ultraviolet rays to said pressure-sensitive adhesive layer being in a thermally plasticized form is effected to cure said pressure-sensitive adhesive layer, and then spontaneous or forced cooling to room temperature is effected, whereby the curing treatment and stress-imparting treatment are effected simultaneously.

* * * * *